(12) United States Patent
Feng et al.

(10) Patent No.: US 8,217,748 B2
(45) Date of Patent: Jul. 10, 2012

(54) COMPACT INDUCTIVE POWER ELECTRONICS PACKAGE

(75) Inventors: Tao Feng, Santa Clara, CA (US); Xiaotian Zhang, San Jose, CA (US); François Hébert, San Mateo, CA (US); Ming Sun, Sunnyvale, CA (US)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 279 days.

(21) Appl. No.: 12/397,473

(22) Filed: Mar. 4, 2009

(65) Prior Publication Data

US 2009/0167477 A1    Jul. 2, 2009

Related U.S. Application Data

(63) Continuation-in-part of application No. 11/986,673, filed on Nov. 23, 2007, now Pat. No. 7,884,452, and a continuation-in-part of application No. 12/011,489, filed on Jan. 25, 2008, now Pat. No. 7,884,696, and a continuation-in-part of application No. 12/391,251, filed on Feb. 23, 2009, now Pat. No. 7,868,431.

(51) Int. Cl.
 *H01F 5/00*   (2006.01)
 *H01F 27/28*  (2006.01)
 *H01L 27/08*  (2006.01)
(52) U.S. Cl. ...................................... 336/200
(58) Field of Classification Search .............. 336/200, 336/232; 257/531
See application file for complete search history.

(56) References Cited

U.S. PATENT DOCUMENTS

| | | | |
|---|---|---|---|
| 3,614,554 A | 10/1971 | Shield et al. | |
| 3,858,138 A | 12/1974 | Gittleman et al. | |
| 4,103,267 A * | 7/1978 | Olschewski | ...................... 336/65 |

(Continued)

FOREIGN PATENT DOCUMENTS

JP           05198440           8/1993

OTHER PUBLICATIONS

International Preliminary Report on Patentability for International Patent Application No. PCT/US08/013043, mailing date Nov. 23, 2007.

(Continued)

*Primary Examiner* — Elvin G Enad
*Assistant Examiner* — Tsz Chan
(74) *Attorney, Agent, or Firm* — Chein-Hwa Tsao; CHEmily LLC

(57) ABSTRACT

An inductive power electronics package is disclosed. It has a circuit substrate with power inductor attached atop. The power inductor has inductor core of closed magnetic loop with an interior window. The closed magnetic loop can include air gap for inductance adjustment. The circuit substrate has bottom half-coil forming elements constituting a bottom half-coil beneath the inductor core. Also provided are top half-coil forming elements interconnected with the bottom half-coil forming elements to form an inductive coil enclosing the inductor core. An inner connection chip can be added in the interior window for interconnecting bottom half-coil forming elements with top half-coil forming elements. An outer connection chip can be added about the inductor core for interconnecting bottom half-coil forming elements with top half-coil forming elements outside the inductor core. A power Integrated Circuit can be attached to the top side of the circuit substrate as well.

20 Claims, 13 Drawing Sheets

U.S. PATENT DOCUMENTS

| | | | |
|---|---|---|---|
| 4,543,553 | A | 9/1985 | Mandai et al. |
| 5,032,815 | A | 7/1991 | Kobayashi et al. |
| 5,041,903 | A | 8/1991 | Millerick et al. |
| 5,070,317 | A | 12/1991 | Bhagat |
| 5,425,166 | A * | 6/1995 | Hastings et al. ............. 29/602.1 |
| 5,428,245 | A | 6/1995 | Lin et al. |
| 5,469,334 | A * | 11/1995 | Balakrishnan ................ 361/782 |
| 5,886,393 | A | 3/1999 | Merrill et al. |
| 5,959,846 | A * | 9/1999 | Noguchi et al. ............. 361/782 |
| 6,236,538 | B1 | 5/2001 | Yamada et al. |
| 6,429,764 | B1 | 8/2002 | Karam et al. |
| 6,608,367 | B1 | 8/2003 | Gibson et al. |
| 6,621,140 | B1 | 9/2003 | Gibson et al. |
| 6,630,881 | B1 | 10/2003 | Takeuchi et al. |
| 6,765,284 | B2 | 7/2004 | Gibson et al. |
| 6,847,104 | B2 | 1/2005 | Huang et al. |
| 6,927,481 | B2 | 8/2005 | Gibson et al. |
| 6,930,584 | B2 | 8/2005 | Edo et al. |
| 6,998,952 | B2 | 2/2006 | Zhou et al. |
| 7,046,114 | B2 | 5/2006 | Sakata |
| 7,091,576 | B2 | 8/2006 | Yamamoto et al. |
| 7,167,073 | B2 | 1/2007 | Hatano |
| 7,196,514 | B2 | 3/2007 | Li |
| 7,229,908 | B1 | 6/2007 | Drizlikh et al. |
| 7,268,659 | B2 | 9/2007 | Nishio et al. |
| 7,368,908 | B2 | 5/2008 | Yamada |
| 7,622,796 | B2 | 11/2009 | Shi et al. |
| 7,786,837 | B2 | 8/2010 | Hebert |
| 2002/0097128 | A1 | 7/2002 | Imam |
| 2003/0070282 | A1 * | 4/2003 | Hiatt et al. ............... 29/602.1 |
| 2004/0169266 | A1 * | 9/2004 | Maxwell ................ 257/684 |
| 2004/0212475 | A1 * | 10/2004 | Schumacher .............. 336/200 |
| 2006/0227518 | A1 | 10/2006 | Nishio et al. |
| 2007/0026676 | A1 | 2/2007 | Li et al. |
| 2008/0061918 | A1 | 3/2008 | Greiff |
| 2008/0094165 | A1 | 4/2008 | Orlando et al. |
| 2008/0238599 | A1 | 10/2008 | Hebert et al. |
| 2009/0057822 | A1 | 3/2009 | Wen et al. |
| 2010/0007456 | A1 | 1/2010 | Joehren et al. |

OTHER PUBLICATIONS

International Search Report for International Patent Application No. PCT/US08/013043, mailed Jan. 26, 2009.

Written Opinion for International Patent Application No. PCT/US08/013043, mailing date Jan. 26, 2009.

USPTO Office Action for U.S. Appl. No. 12/011,489, mailing date Mar. 19, 2010.

USPTO Office Action for U.S. Appl. No. 12/011,489, mailing date Aug. 19, 2010.

* cited by examiner

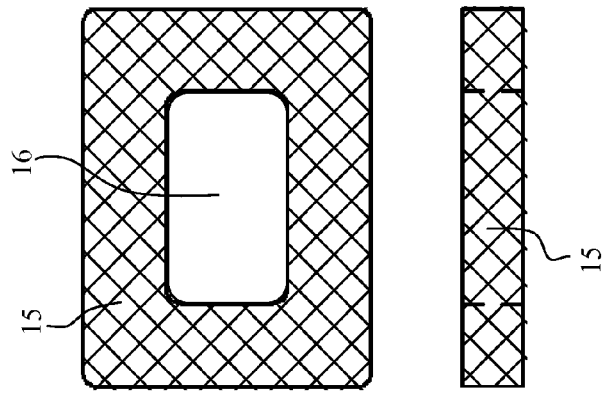
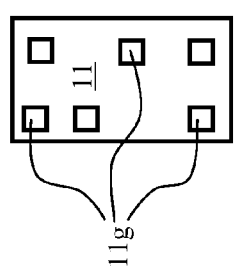
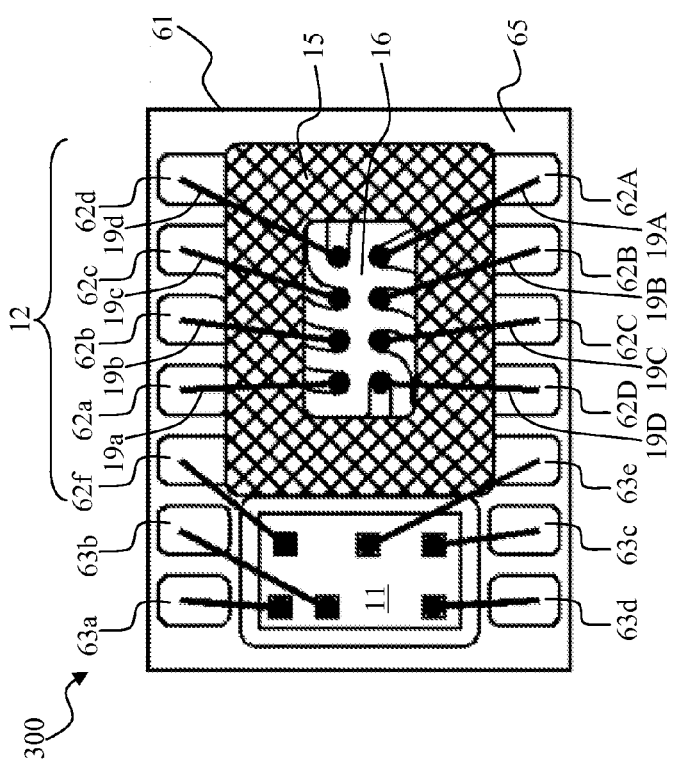

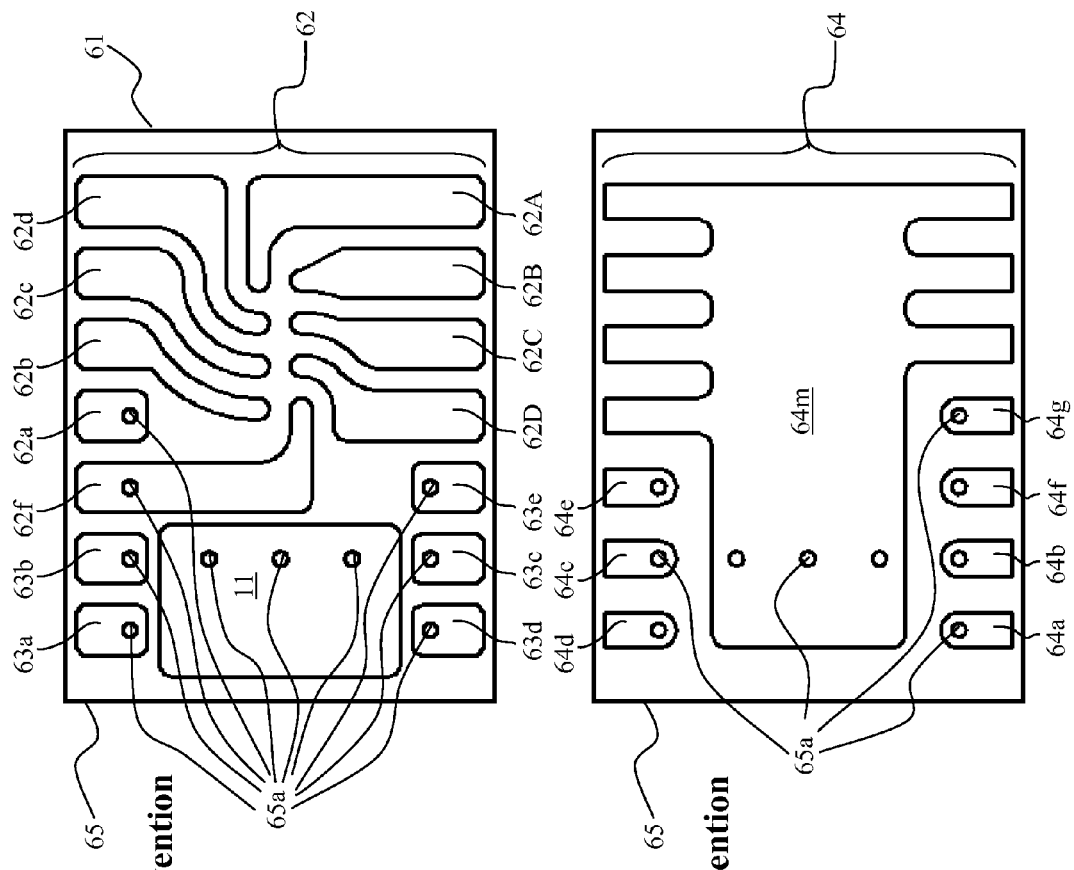
Fig. 1E Present Invention
Fig. 1F Present Invention

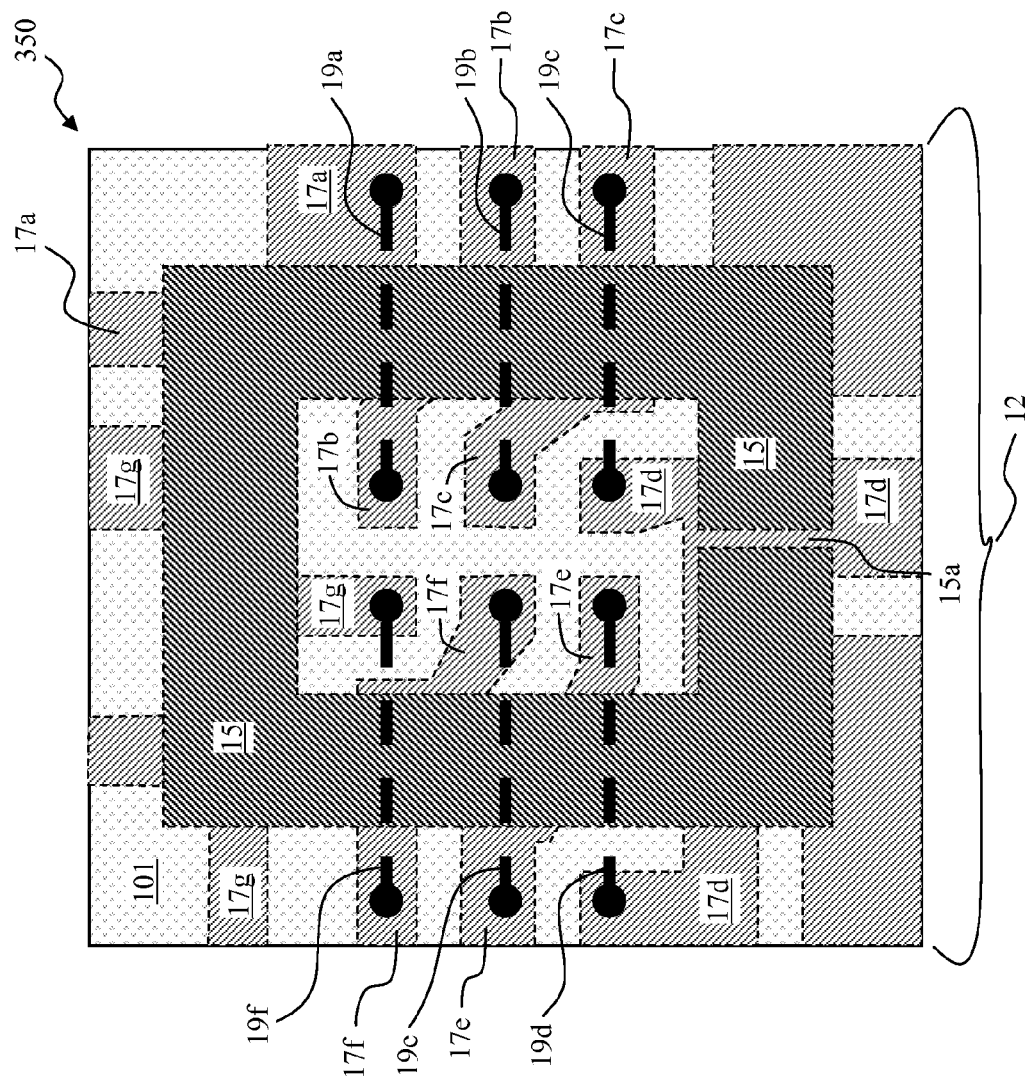
Fig. 2 Present Invention

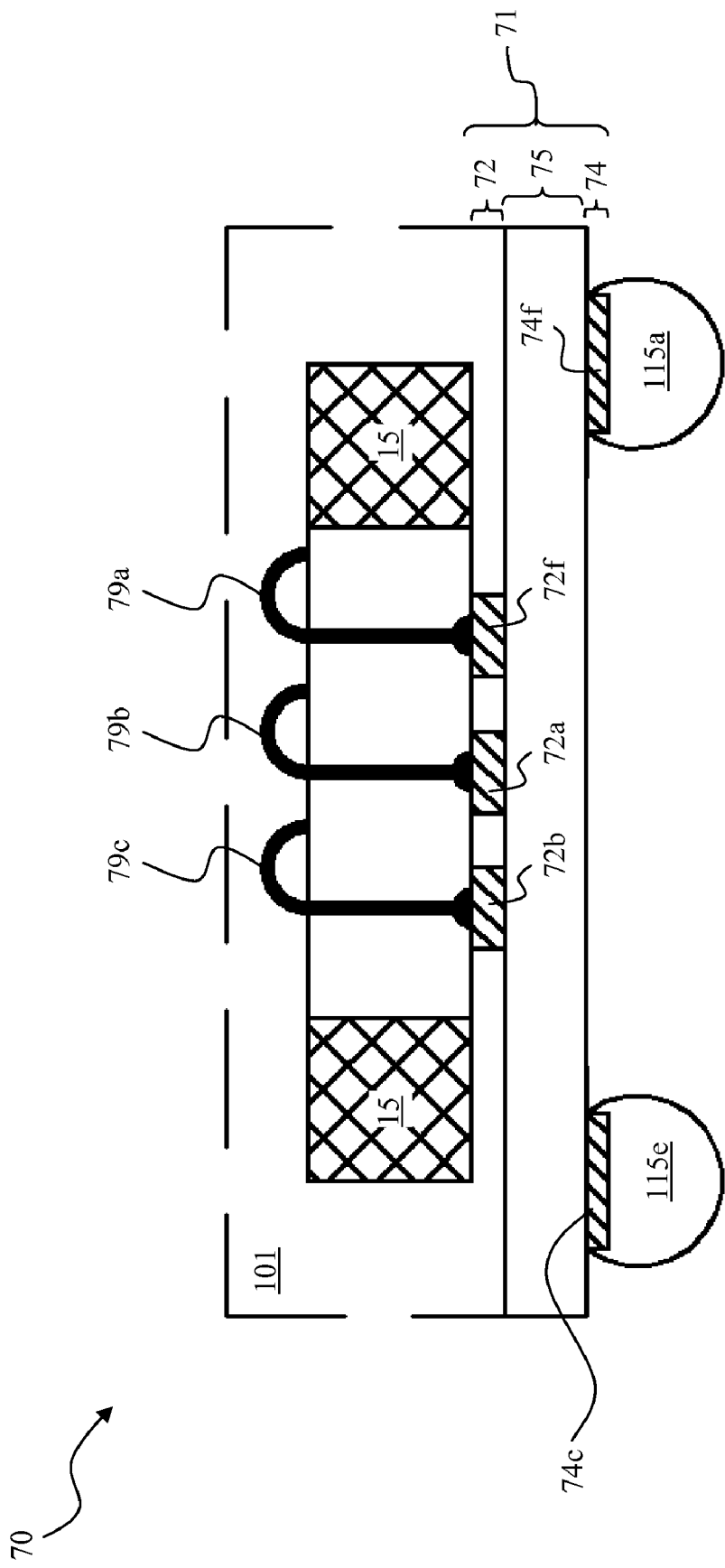
Fig. 3A Present Invention

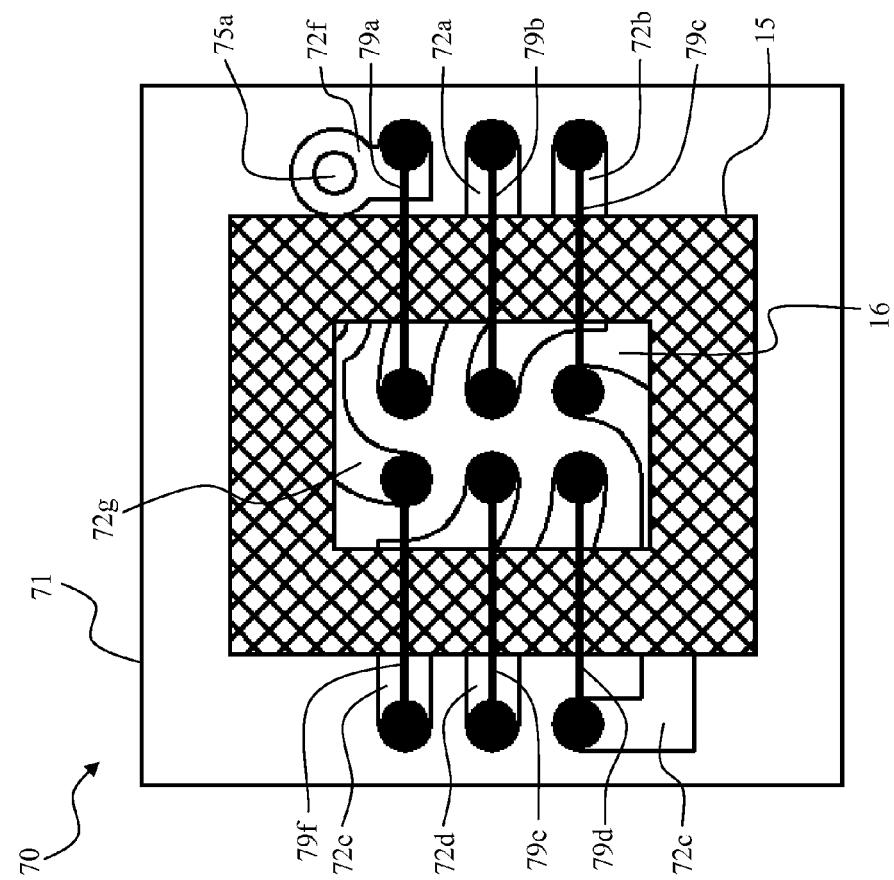
Fig. 3D Present Invention
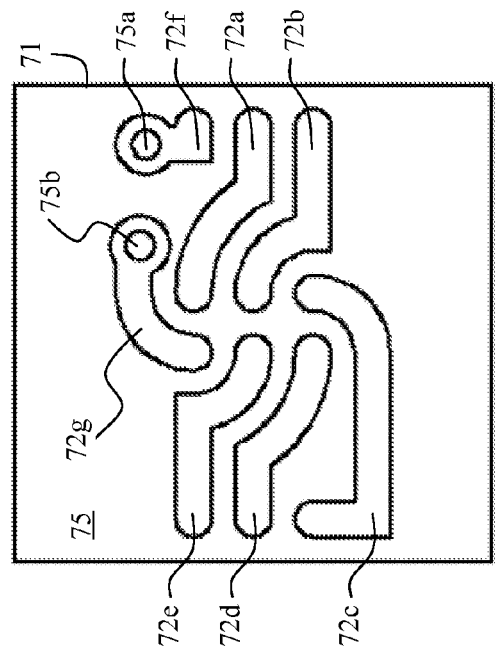
Fig. 3B Present Invention
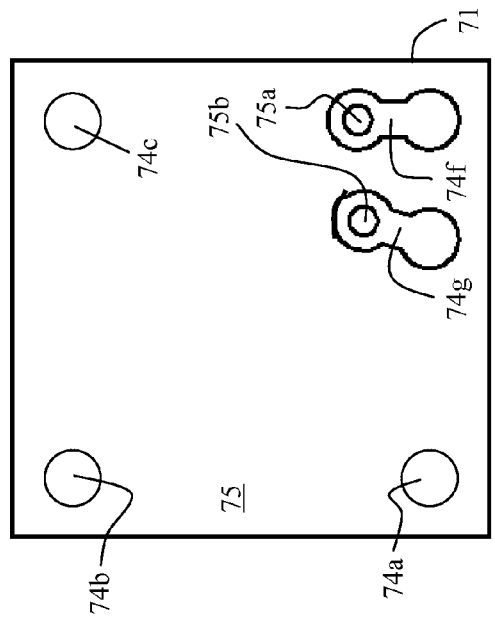
Fig. 3C Present Invention

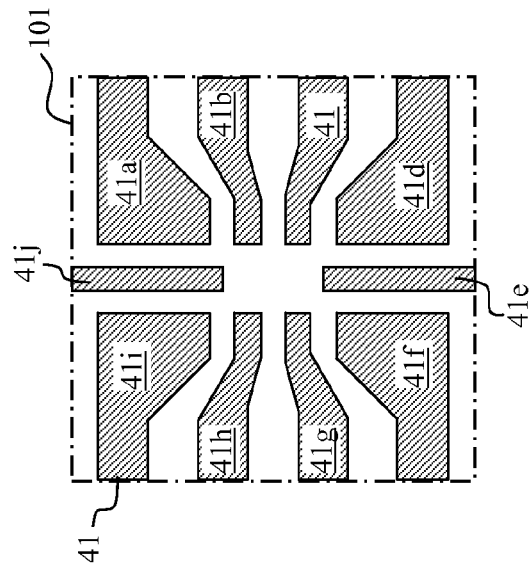
Fig. 4B Present Invention
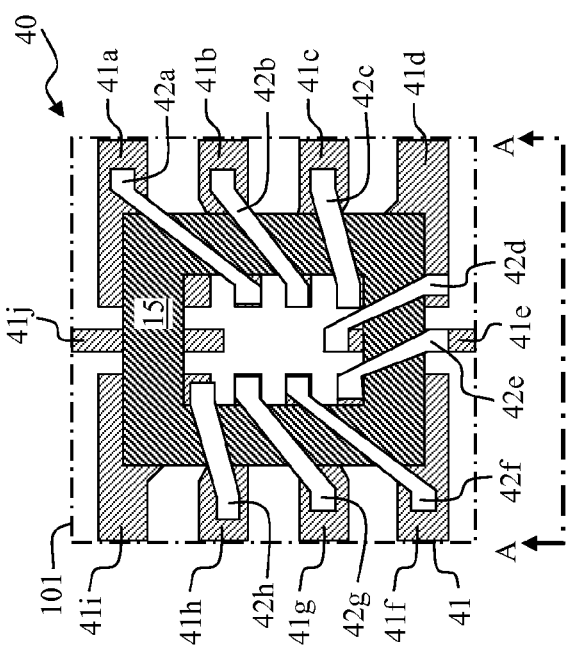
Fig. 4A Present Invention
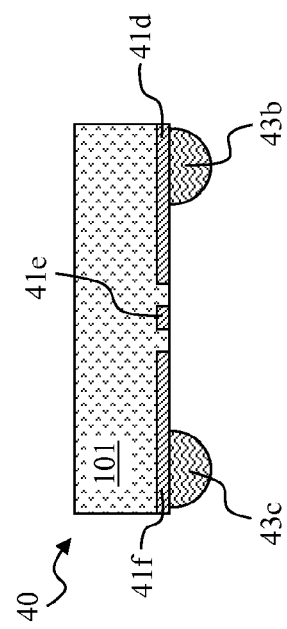
Fig. 4C Present Invention View A-A

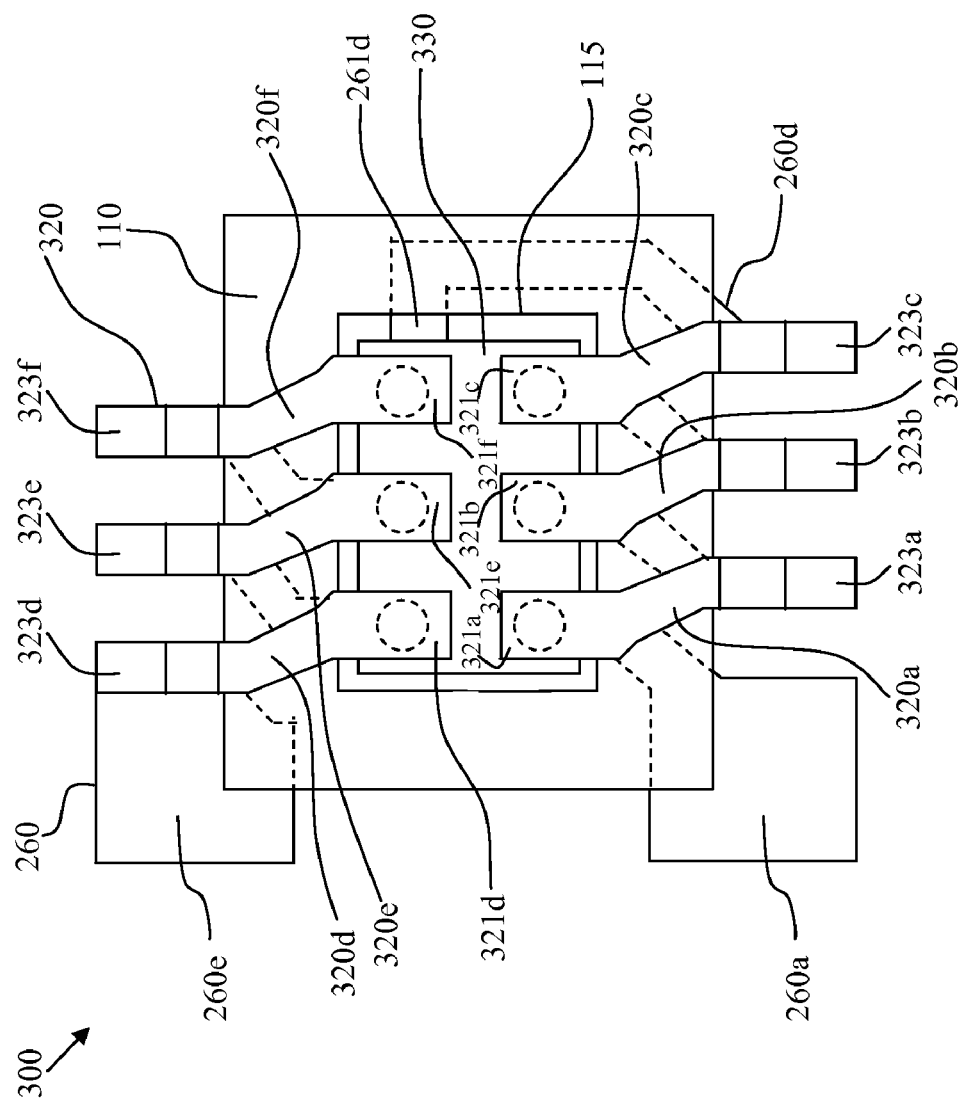

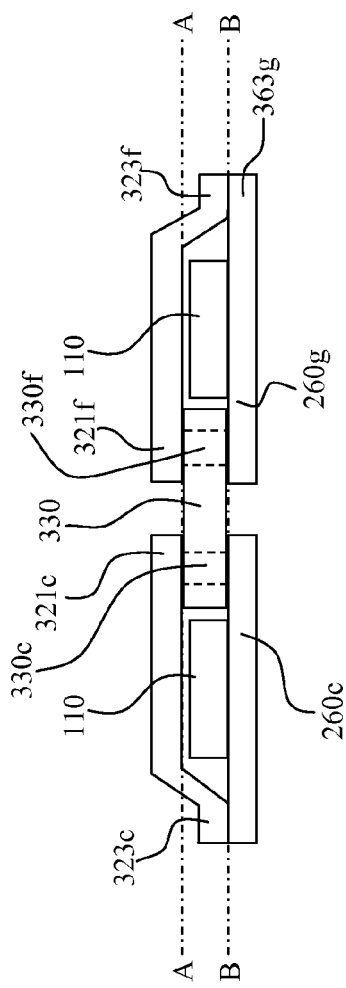
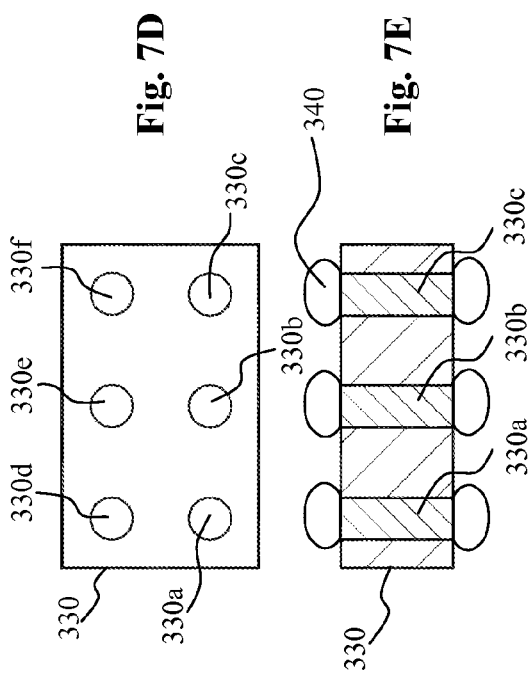
Fig. 7C
Fig. 7D
Fig. 7E

COMPACT INDUCTIVE POWER ELECTRONICS PACKAGE

CROSS REFERENCE TO RELATED APPLICATIONS

The present invention is a continuation in part application of:
1. application Ser. No. 11/986,673 filed on Nov. 23, 2007 now U.S. Pat. No. 7,884,452 and entitled "Semiconductor Power Device Package Having a Lead Frame-Based Integrated Inductor" by Tao Feng et al, hereinafter referred to as "application Ser. No. 11/986,673"
2. application Ser. No. 12/011,489 filed on Jan. 25, 2008 now U.S. Pat. No. 7,884,696 and entitled "Lead Frame-Based Discrete Power Inductor" by François Hébert et al, hereinafter referred to as "application Ser. No. 12/011,489"
3. application Ser. No. 12/391,251 filed on Feb. 23, 2009 now U.S. Pat. No. 7,868,431 and entitled "Compact Power Semiconductor Package and Method with Stacked Inductor and Integrated Circuit Die" by Tao Feng, et al the entire disclosure of the above is hereby incorporated by reference.

FIELD OF INVENTION

This invention relates generally to the field of electronic system packaging. More specifically, the present invention is directed to the physical level packaging of discrete power inductors or power inductors together with semiconductor dies.

BACKGROUND OF THE INVENTION

Due to ongoing market demand, power semiconductor packages are continuously being driven toward smaller size and/or footprint while handling increasing power levels. One common power semiconductor package for a variety of power converters (boost and buck converters, etc.) deals with the packaging of inductive components and semiconductor Integrated Circuit (IC) dies, for which a large amount of prior arts exist. One such prior art is U.S. Pat. No. 6,930,584 entitled "Microminiature power converter" by Edo et al and granted on Aug. 16, 2005, hereinafter referred to as the Edo patent. The Edo patent is briefly illustrated in FIG. 5A and FIG. 5B. A thin film inductor is illustrated in FIG. 5A. The thin film inductor 1 has a ferrite substrate 7 partially enclosed by numerous solenoid coil conductors. The ferrite substrate 7 is electrically insulating. As seen in FIG. 5A, a first portion of the solenoid coil conductors includes a number of top coil conductors 4 formed on the top principal plane of the ferrite substrate 7. A second portion of the solenoid coil conductors includes a number of bottom coil conductors 5 formed on the bottom principal plane of the ferrite substrate 7. Numerous connection conductors 3 are also formed in through holes passing through the ferrite substrate 7 for connecting the first portion 4 and the second portion 5 of the solenoid coil conductors thus forming a solenoid type inductor with the ferrite substrate 7 acting as its core. Additional through holes 6c can be formed then metalized along the periphery of the ferrite substrate 7 to connect top electrodes 6a with bottom electrodes 6b for making external contacts to the thin film inductor, and to allow electric signals to be routed through the ferrite substrate 7. FIG. 5B illustrates cross section of a microminiature power converter packaged in the form of a chip size module. The chip size module includes a semiconductor IC 8 bonded atop the thin film inductor 1 of FIG. 5A via numerous stud bumps 9 on electrodes (not specifically shown) on the semiconductor IC and numerous top electrodes 6a on the thin film inductor. The cross section of the thin film inductor 1 portion of the chip size module is taken along cross section X-X of FIG. 5A. An under-fill (not shown) can also be applied between the thin film inductor 1 and the semiconductor IC 8 for passivation of the chip size module. It is noted here that the thin film inductor 1, with its ferrite substrate 7 formed with three-dimensional features of central and peripheral through holes 3, 6c, solenoid coil conductors 4, 5, and electrodes 6a, 6b, can be complicated thus costly to make. Another drawback is that the fragile ferrite chip is exposed without protection.

Another prior art is U.S. Pat. No. 5,428,245 entitled "Lead frame including an inductor or other such magnetic component" by Lin et al and granted on Jun. 27, 1995, hereinafter referred to as the Lin patent. The Lin patent is briefly illustrated in FIG. 6. A lead frame having numerous electrically conductive leads is shown for use in an integrated circuit package. The lead frame also includes a central integral first inductor winding. Additional windings may be formed as an integral part of the lead frame and then folded into position over the first winding to form a multiple layered magnetic component winding. In one embodiment, the lead frame based winding is coated with a magnetic material to form a lead frame based inductor. It is noted here that while the disclosed lead frame inductor winding can serve as a signal inductor, without a substantial volume of magnetic core material this lead frame inductor may be unable to satisfy power applications where a high inductance value and low winding resistance are required.

Therefore, the present invention targets a compact, simple to make inductive power electronics package exhibiting a high inductor rating which includes inductance value and its saturation current.

SUMMARY OF THE INVENTION

A compact inductive power electronics package with high inductor rating is disclosed, it has:
  A circuit substrate.
  A power inductor attached atop the circuit substrate. The power inductor has an inductor core of closed magnetic loop with an interior window. In a more specific embodiment, the inductor core has a toroid shape. Optionally, the inductor core can include an air gap for adjustment of the inductance, while retaining its closed magnetic loop.
  The circuit substrate has numerous bottom half-coil forming elements constituting a bottom half-coil beneath the inductor core.
  Numerous top half-coil forming elements interconnected with the bottom half-coil forming elements so as to jointly form an inductive coil enclosing the inductor core.

In a related embodiment, ones of the top half-coil forming means may couple the ends of ones of the bottom half-coil forming means exposed through the interior window of the inductor core to the ends of adjacent ones of the bottom half-coil forming means outside the inductor core to form the inductive coil. In other words, one end of each top half-coil forming element may connect with the end of one of the bottom half-coil forming elements within the interior window while the other end of the top half-coil forming element may connect with the end of an adjacent bottom half-coil forming element outside the inductor core to form the inductive coil about the inductor core. Most of the bottom half-coil forming elements have one end within the interior window of the inductor core, and one end on the outside of the inductor core.

In a related embodiment, an inner connection chip can be added in the interior window of the inductor core for interconnecting the bottom half-coil forming elements with the top half-coil forming elements within the interior window. In another related embodiment, an outer connection chip can be added around the inductor core for interconnecting the bottom half-coil forming elements with the top half-coil forming elements outside the inductor core.

A power Integrated Circuit (IC) can be attached to the package and interconnected with the power inductor. In a more specific embodiment, the power IC may be attached to the top side of the circuit substrate and additional circuit interconnecting elements provided on the circuit substrate for interconnecting the power IC and the power inductor. The power IC can be located either atop or adjacent the inductor core. The power IC can even be located within the window of the inductor core to save package foot print and thickness. The power IC may include a power transistor together with an IC controller to control the power transistor.

In a more specific embodiment, the circuit substrate is a lead frame and the bottom half-coil forming elements are numerous lead frame leads forming the bottom half-coil. The top half-coil forming elements may be numerous top lead frame leads each looping the inductor core from above and further connecting with proper alternative members of the lead frame leads below to form the inductive coil. As a second alternative, the top half-coil forming elements can be numerous top bond wires each looping the inductor core from above and further connecting with proper alternative members of the lead frame leads below to form the inductive coil. As a third alternative, the top half-coil forming elements can be made of three dimensionally formed top interconnection plates each looping the inductor core from above and further connecting with proper alternative members of the lead frame leads below to form the inductive coil.

In another more specific embodiment, the circuit substrate is a multi-layer circuit laminate (MCL), such as a printed circuit board (PCB), having a top conductive trace layer with numerous half-coil patterned conductive traces constituting the bottom half-coil forming elements. Correspondingly, and similar to the case of lead frame substrate, the top half-coil forming elements can be numerous top lead frame leads, top bond wires or three dimensionally formed top interconnection plates. Alternatively, the MCL may be a bismaleimide-triazine (BT) substrate.

It should be apparent to one skilled in the art that the top half-coil forming elements may be made of any conducting material (e.g., bond wires, a top lead frame, interconnection plates) which can properly connect to the bottom half-coil forming elements. Similarly the circuit substrate having bottom half-coil forming elements may be formed of any suitable material, such as lead frame, PCB, or BT substrate.

A method for making the above inductive power electronics package is proposed, the method includes:
Providing a circuit substrate having numerous bottom half-coil forming elements atop.
Attaching a power inductor atop the circuit substrate by:
placing an inductor core of closed magnetic loop with an interior window atop the bottom half-coil forming elements.
attaching numerous top half-coil forming elements such that they are interconnected with the bottom half-coil forming elements so as to jointly form an inductive coil enclosing the inductor core.

As an added option, attaching a power IC atop the circuit substrate.
As another added option encapsulating the top portion of the inductive power electronics package, including the inductor core and the top half-coil forming means.
Attaching numerous top half-coil forming elements may include connecting each top half-coil forming element to an end of a bottom half-coil forming element within the interior window and to an end of an adjacent bottom half-coil forming element outside the inductor core.
These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 7A through FIG. 7E are excerpted figures from U.S. application Ser. No. 12/011,489;

FIG. 1A through FIG. 1F illustrate a first embodiment of the present invention compact inductive power electronics package with a closed magnetic loop power inductor and a power IC chip co-located atop a 2-layer PCB; and FIG. 2 illustrates a second embodiment of the present invention compact inductive power electronics package with a power inductor of closed magnetic loop located atop a lead frame.

FIG. 3A through FIG. 3D illustrate another embodiment of the present invention compact inductive power electronics package as a discrete power inductor of closed magnetic loop located atop a PCB.

FIG. 4A through FIG. 4C illustrate another embodiment of the present invention compact inductive power electronics package as a discrete power inductor of closed magnetic loop located atop a lead frame, and employing interconnection plates as the top half-coil forming means.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 5B:
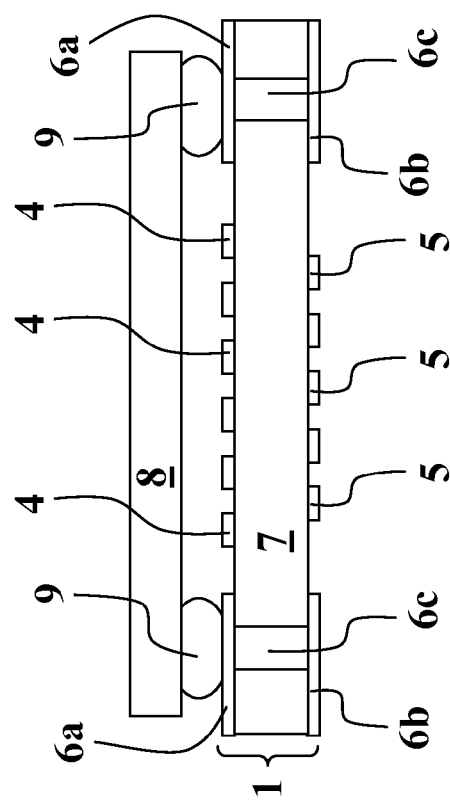
FIG. 5A and FIG. 5B illustrate a prior art microminiature power converter using a thin film inductor of solenoid coil type.
Figure 5A:
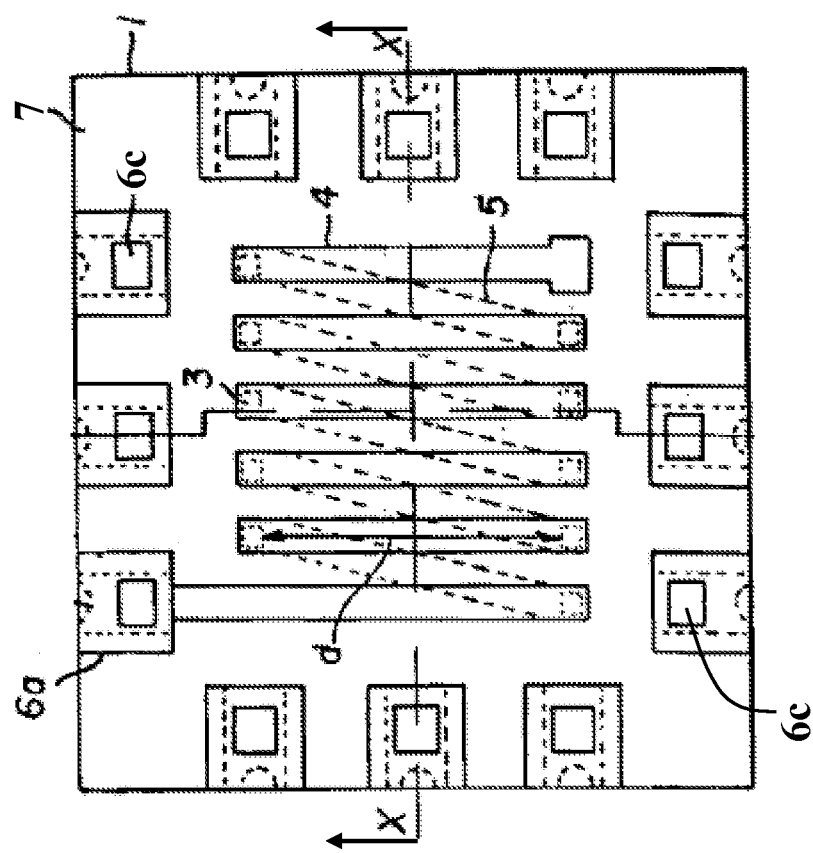
Figure 6:
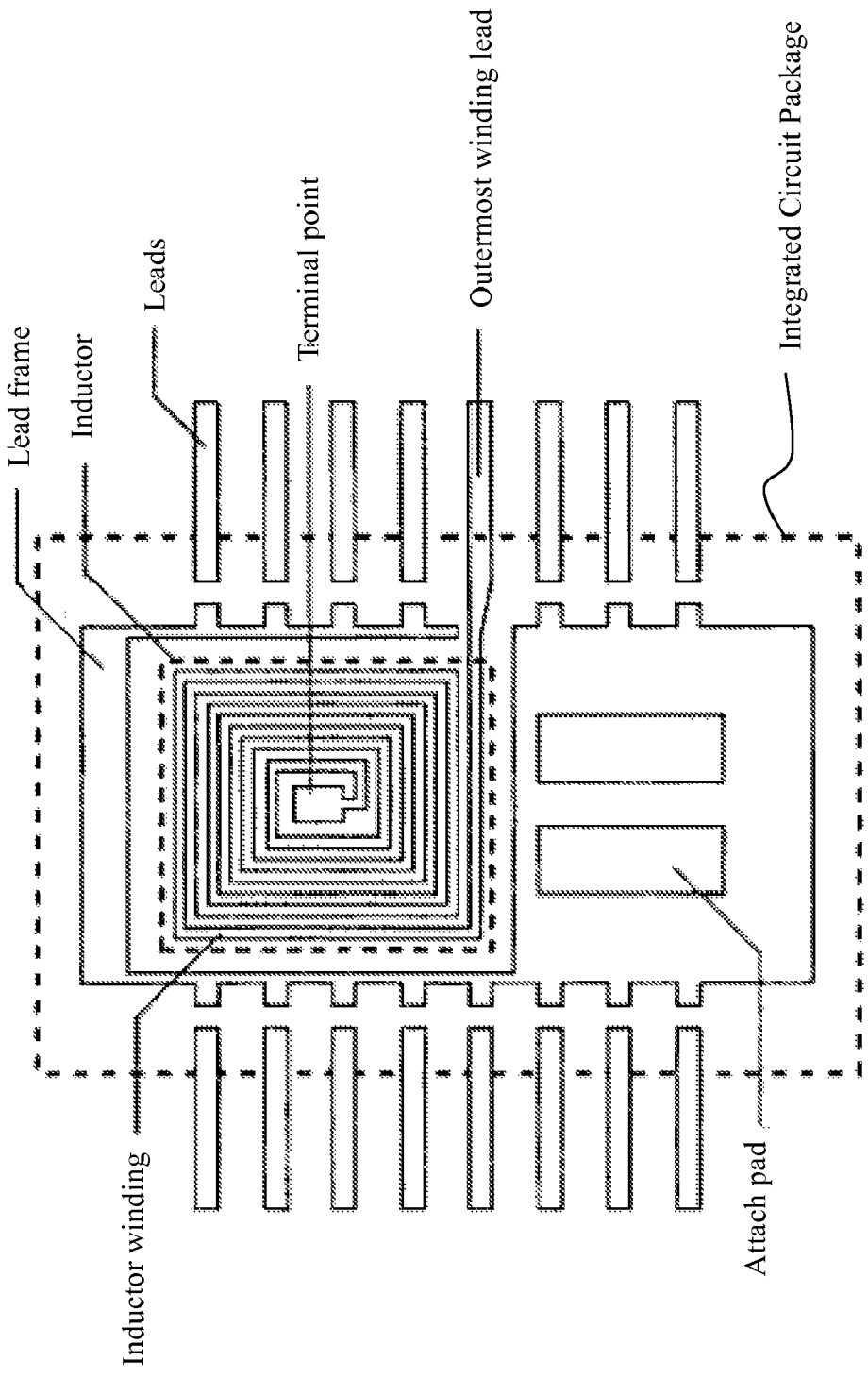
FIG. 6 illustrates a prior art lead frame based inductor of planar coil geometry.
Figure 7B:
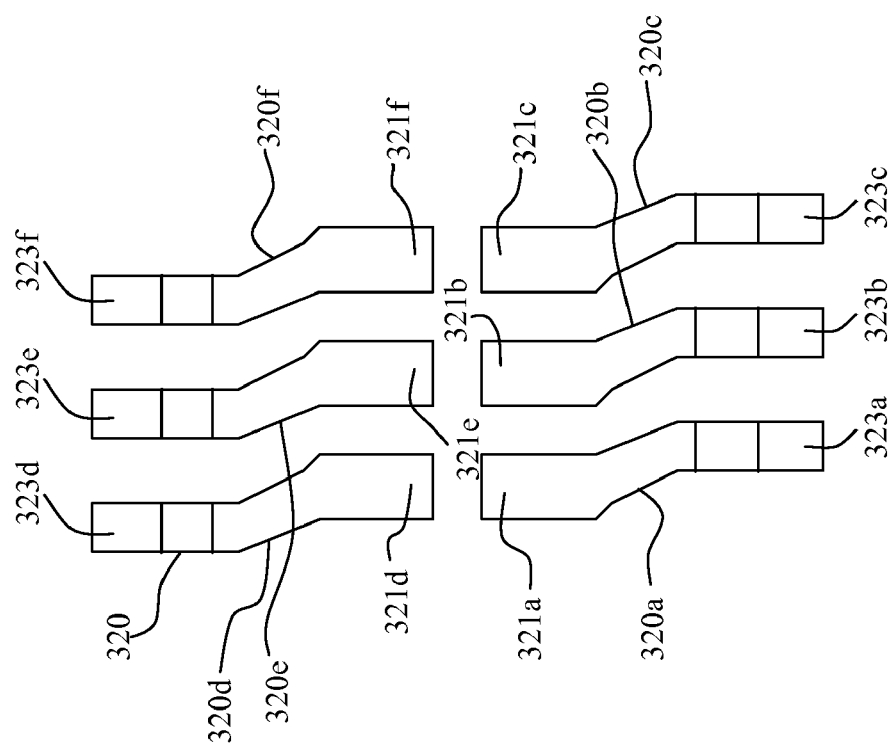

To facilitate understanding and appreciation of the present invention, FIG. 7A through FIG. 7E together with their description are excerpts, with renumbering of figure number, from U.S. application Ser. No. 12/011,489 as follows:

FIG. 7A is a top plan view of an embodiment of the lead frame-based discrete power inductor in accordance with the invention. FIG. 7B is a top plan view of a top lead frame in accordance with the invention. FIG. 7C is a schematic side elevation view of the lead frame-based discrete power inductor of FIG. 7A. FIG. 7D is a top plan view of an interconnection chip in accordance with the invention. FIG. 7E is a cross sectional view of the interconnection chip of FIG. 7D.

An embodiment of a lead frame-based discrete power inductor generally designated 300 is shown in FIG. 7A wherein portions of the leads of the bottom lead frame 260 are shown in phantom lines. Power inductor 300 comprises the planar bottom lead frame 260, a top lead frame 320, the leads of which are interconnected about the magnetic core 110. An interconnection chip 330 is disposed in the window 115 (FIG. 7C) and enables connection between the inner contact sections of the top and bottom lead frame leads.

With reference to FIG. 7B, the top lead frame 320 includes a first set of leads 320a, 320b and 320c disposed on a first side of the top lead frame 120. Top leads 320a, 320b and 320c have a non-linear, stepped configuration to facilitate connection with leads of the bottom lead frame 260 to form the coil as further disclosed herein. Top leads 320a, 320b and 320c include inner contact sections 321a, 321b and 321c respectively disposed on a plane A-A of planar portions of the top leads 320a, 320b and 320c. Top leads 320a, 320b and 320c further include outer contact sections 323a, 323b and 323c respectively disposed on a plane B-B parallel, and below the plane A-A.

Top lead frame 320 further includes a second set of leads 320d, 320e and 320f disposed on a second side of the top lead frame 320. Top leads 320d, 320e and 320f have a non-linear, stepped configuration to facilitate connection with leads of the bottom lead frame 260 to form the coil as further disclosed herein. Top leads 320d, 320e and 320f include inner contact sections 321d, 321e and 321f respectively disposed on the A-A. Top leads 320d, 320e and 320f further include outer contact sections 323d, 323e and 323f respectively disposed on the plane B-B. The connection about the magnetic core 110 of the leads of the top and bottom lead frames 320 and 260 respectively provides the coil.

The interconnection chip 330 is shown in FIG. 7D and FIG. 7E and includes six conductive through vias 330a, 330b, 330c, 330d, 330e and 330f (shown in phantom lines in FIG. 7A) spaced and configured to provide interconnection between the inner contact sections of the leads of the top lead frame 320 and the bottom lead frame 260. Solder bumps 340 are preferably formed on top and bottom surfaces of the interconnection chip 330 to facilitate interconnection.

A coil is formed about the magnetic core 110 as shown in FIG. 7A. The inner contact sections of the leads 260a, 260b, 260c, 260d, 260f and 260g of the bottom lead frame 260 are coupled to the inner contact sections 321a, 321b, 321c, 321d, 321e and 321f of the top lead frame 320 by means of the interconnection chip 330. The outer contact sections of the leads 260b, 260c, 260d, 260e, 260f and 260g of the bottom lead frame 260 are coupled to the outer contact sections 323a, 323b, 323c, 323d, 323e and 323f of the top lead frame 320 around a periphery of the magnetic core 110.

The inner contact section 261a of the lead 260a is coupled to the inner contact section 321a of the lead 320a by means of via 330a. The outer contact section 323a of the lead 320a is coupled to the outer contact section 263b of the adjacent lead 260b. The inner contact section 261b of the lead 260b is coupled to the inner contact section 321b of the lead 320b by means of via 330b. The outer contact section 323b of the lead 320b is coupled to the outer contact section 263c of the adjacent lead 260c. The inner contact section 261c of the lead 260c is coupled to the inner contact section 321c of the lead 320c by means of via 330c. The outer contact section 322c of the lead 320c is coupled to the outer contact section 263d of the adjacent lead 260d. The routing section 265d routes the coil circuit to connect the inner contact section 261d of the lead 260d to the inner contact section 321f of the lead 320f by means of via 330f. The outer contact section 323f of the lead 320f is coupled to the outer contact section 263g of the adjacent lead 260g. The inner contact section 261g of the lead 260g is coupled to the inner contact section 321e of the lead 320e by means of via 330e. The outer contact section 323e of the lead 320e is coupled to the outer contact section 263f of the adjacent lead 260f. The inner contact section 261f of the lead 260f is coupled to the inner contact section 321d of the lead 320d by means of via 330d. The outer contact section 323d of the lead 320d is coupled to the outer contact section 263e of the adjacent lead 260e. As in the first and second embodiments, the non-linear, stepped configurations of the top and bottom lead frame leads provide for alignment and spacing of the inner and outer contact sections.

The discrete power inductor 300 may include terminals 260a and 260e, the interconnection between the leads of the top and bottom lead frames 320 and 260 facilitated by the interconnection chip 330 forming the coil about the magnetic core 110.

The discrete power inductor 300 may be encapsulated with an encapsulant to form a package (not shown). The encapsulant may include conventional encapsulating materials. Alternatively, the encapsulant may include materials incorporating magnetic powders such as ferrite particles to provide shielding and improved magnetic performance.

In the embodiment shown in FIGS. 7A to 7E (lead frame-based discrete power inductor 300), the circuit substrate with the bottom half-coil forming elements is the bottom lead frame 260. The top half-coil forming elements are the top lead frame 320. The inductor core with an interior window is the magnetic core 110 with window 115. A connection chip 330 in the window 115 facilitates connection between the top half-coil forming elements 320 and the bottom half-coil forming elements 260. The power inductor 300 is discrete and is not packaged with a power IC.

Figure 8A:
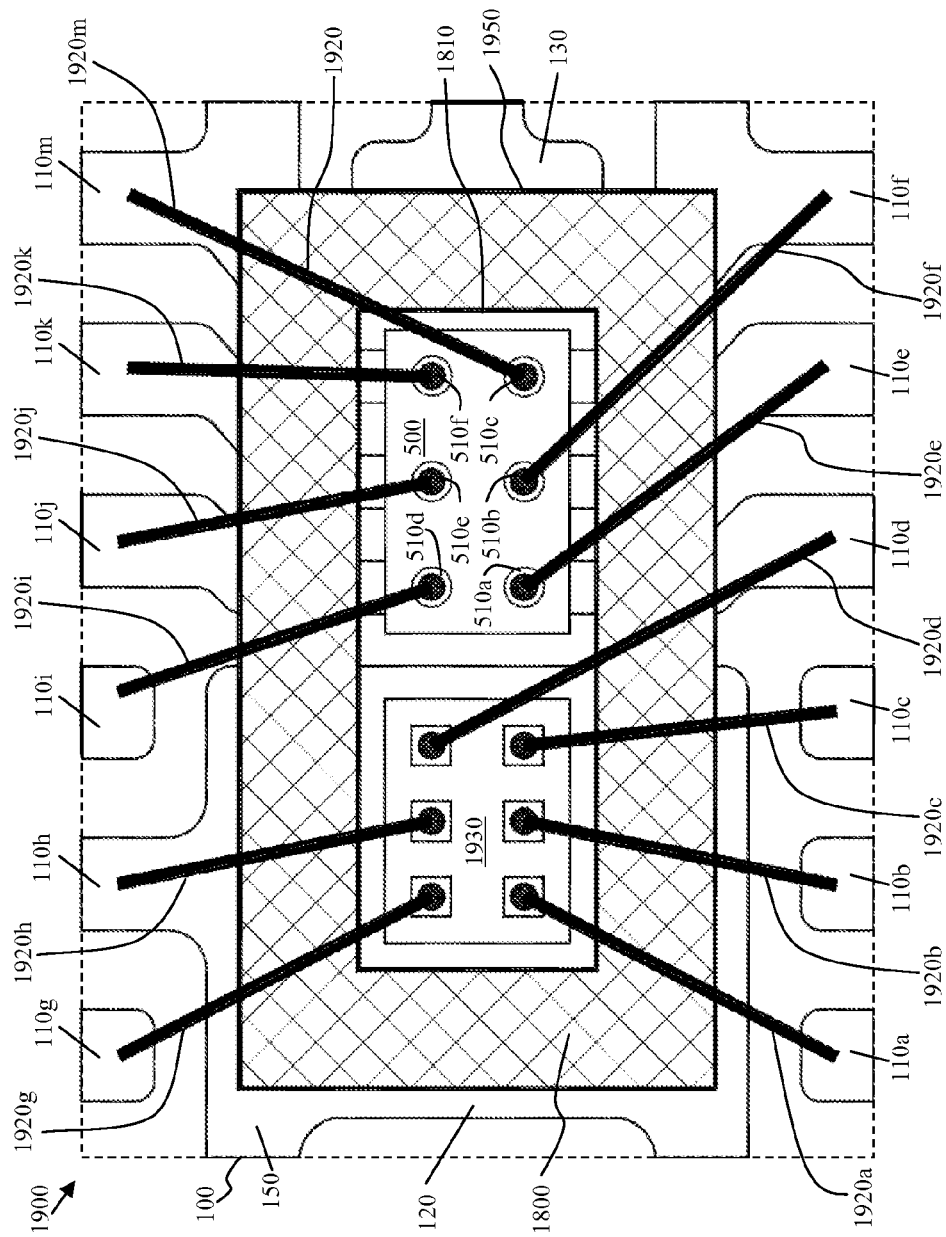
FIG. 8A through FIG. 8B are excerpted figures from U.S. application Ser. No. 11/986,673.
Figure 8B:
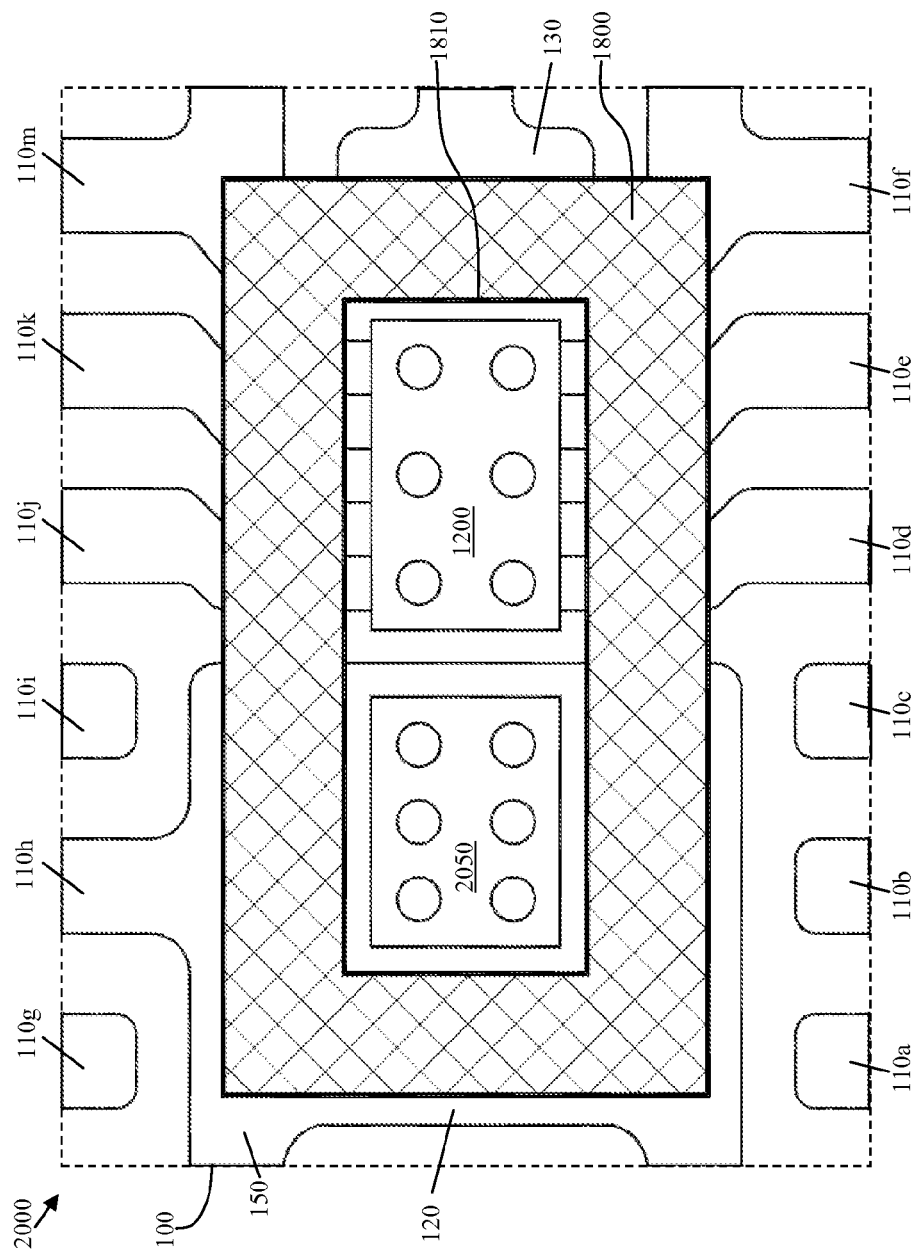

To facilitate understanding and appreciation of the present invention, FIG. 8A through FIG. 8B together with their description are excerpts, with renumbering of figure number, from application Ser. No. 11/986,673 as follows:

FIG. 8A is a top plan view of another embodiment of a semiconductor power device package having a lead frame-based integrated inductor in accordance with the invention. FIG. 8B is a top plan view of a bottom portion of a sixth embodiment of a semiconductor power device package having a lead frame-based integrated inductor in accordance with the invention.

An embodiment of the invention is shown in FIG. 8A and includes a semiconductor power device package 1900 having a lead frame-based integrated inductor 1950. The inductor 1950 is comprised of the ferrite chip 1800, a plurality of adjacent leads of the lead frame 100 and bonding wires 1920e, 1920f, 1920i, 1920j, 1920k and 1920m. Connection chip 500 provides electrical connection by means of vias 510a-510f formed in the connection chip 500. The ferrite chip 1800 is attached to a top surface 150 of the lead frame 100 and is supported by the large pad 120 and the small pad 130. The ferrite chip 1800 is disposed on the top surface 150 of the lead frame 100 in such manner that lead ends 140d-140f and 140*j*-140*m* are accessible through the window 1810. A power IC 1930 is also accessible through the window 1810.

Connection chip 500 is sized and configured to fit within the window 1810. Vias 510*a*-510*f* are formed and positioned on the connection chip 500 such that they overlay the lead ends 140*d*-140*f* and 140*j*-140*m* of the lead frame 100, with conductive epoxy or solder, for electrical connection thereto. The power IC 1930 is disposed adjacent the connection chip 500 in the window 1810.

Bonding wires couple adjacent leads of the lead frame 100 to provide a closed magnetic circuit around the ferrite chip 1800 core. Bonding wire 1920*e* couples the end 140*d* of the lead 110*d* to the adjacent lead 110*e* through via 510*a*, the bonding wire 1920*e* and the adjacent leads 110*d* and 110*e* forming a loop around the ferrite chip 1800. Bonding wire 1920*f* couples the end 140*e* of the lead 110*e* to the adjacent lead 110*f* through via 510*b*, the bonding wire 1920*f* and the adjacent leads 110*e* and 110*f* forming a loop around the ferrite chip 1800. Bonding wire 1920*m* couples the end 140*f* of the lead 110*f* to the adjacent lead 110*m* through via 510*c*, the bonding wire 1920*m* and the adjacent leads 110*f* and 110*m* forming a loop around the ferrite chip 1800. Bonding wire 1920*k* couples the end 140*m* of the lead 100*m* to the adjacent lead 110*k* through via 510*f*, the bonding wire 1920*k* and the adjacent leads 110*m* and 110*k* forming a loop around the ferrite chip 1800. Bonding wire 1920*j* couples the end 140*k* of the lead 110*k* to the adjacent lead 110*j* through via 510*e*, the bonding wire 1920*j* and the adjacent leads 110*k* and 110*j* forming a loop around the ferrite chip 1800. Bonding wire 1920*i* couples the end 140*j* of the lead 110*j* to the adjacent lead 110*i* through via 510*d*, the bonding wire 1920*i* and the adjacent leads 110*j* and 110*i* forming a loop around the ferrite chip 1800. Leads 110*d* and 110*i* comprise the leads of the inductor 1950.

The power IC 1930 is attached to the large pad 120 of the lead frame 100. Bonding wire 1920*d* couples the power IC 1930 to the lead 110*d* and thereby to the lead frame-based integrated inductor 1950. Bonding wires 1920*a*, 1920*b*, and 1920*c* couple the power IC 1930 to leads 110*a*, 110*b* and 110*c* respectively. Bonding wires 1920*g* and 1920*h* couple the power IC 1930 to leads 110*g* and 110*h* respectively.

Due to the utilization of the connection chip 500, use of a specialized bonding tool such as the K&S Close Center Bond bottleneck bonding tool is not required—a standard bonding tool will suffice.

An encapsulant completes the semiconductor power device package 1900 and fills the half-etched regions of the leads 110*a*-110*m* to lock the lead frame 100 so that leads are unlikely to detach from the package. The outline of the encapsulant is shown by a dashed line.

In the embodiment shown in FIGS. 8A to 8B (semiconductor power device package 1900), the circuit substrate with the bottom half-coil forming elements is the lead frame 100. The top half-coil forming means are the bonding wires 1920*d* to 1920*f*, and 1920*i* to 1920*m*. The inductor core is the ferrite chip 1800 having window 1810. The semiconductor power device package 1900 includes the power IC 1930 which is located inside the window 1810, along with a connection chip 500.

FIG. 1A through FIG. 1F illustrate a compact inductive power electronics package 300 of the present invention with a power inductor 12 and a power IC die 11 co-located atop a MCL which in this case is a 2-layer printed circuit board 61. The power inductor 12 has an inductor core ferrite chip 15 of closed magnetic loop in the shape of a rectangle with an interior window 16. To those skilled in the art, to achieve high inductance with a compact inductor size, it is highly important to shape the ferrite chip 15 into a closed loop for confining most magnetic fluxes in it whereas the specific shape of this "closed loop" is of somewhat secondary importance. Thus, for example, the closed loop can alternatively be shaped into a square, a polygon, an ellipse or a toroid. Nevertheless, it is generally felt that the toroid shape should provide the most efficient magnetic flux confinement. The path of the closed magnetic loop runs around the interior window 16. The two-layer printed circuit board 61 has a top conductive trace layer 62, a bottom conductive trace layer 64 and an intervening insulation layer 65 isolating the conductive trace layers 62 and 64 from each other. FIG. 1A is a top view of the inductive power electronics package 300 with its encapsulant removed for better visibility of the various internal components. FIG. 1B and FIG. 1C are top and side cross sectional views of the ferrite chip 15 that is part of the power inductor 12. FIG. 1D is a top view of the power IC die 11 with a number of IC-contact pads 11*g* on top. FIG. 1E is a top view of the top conductive trace layer 62. FIG. 1F is a bottom view of the bottom conductive trace layer 64.

Next, the top conductive trace layer 62 has a first number of half-coil patterned conductive traces 62*a*-62*d*, 62*f* and 62A-62D positioned beneath the inductor core which may be ferrite chip 15. In essence, 62*a*-62*d*, 62*f* and 62A-62D form a bottom half-coil of the power inductor 12. Correspondingly, a second number of top half-coil forming bond wires 19*a*-192*d* and 19A-19D are located atop the ferrite chip 15 with each bond wire looping the ferrite chip 15 from above. Furthermore, both ends of each top half-coil forming bond wire are connected to proper alternative bottom half-coil patterned conductive traces so as to jointly form an inductive coil enclosing the ferrite chip 15. Thus, for example, the ends of top half-coil forming bond wire 19*a* are bonded on one side to the end of half-coil patterned conductive trace 62*a* outside the ferrite chip 15 and on the other side to the end of the adjacent half-coil patterned conductive trace 62*b* inside the interior window 16 of the ferrite 15. The ends of top half-coil forming bond wire 19*b* are similarly bonded to the half-coil patterned conductive traces 62*b* and 62*c*. The ends of top half-coil forming bond wire 19*c* are bonded to the half-coil patterned conductive traces 62*c* and 62*d*, etc. Finally, the ends of top half-coil forming bond wire 19D are bonded to the half-coil patterned conductive traces 62D and 62*f*. As a result, the half-coil patterned conductive traces 62*f* and 62*a* of the top conductive trace layer 62 also become the two device terminals of the power inductor 12 for circuit connection with other components of the inductive power electronics package 300, for example with the power IC die 11 via additional bond wires. Other bonding pads 63*a*-63*e* of the top conductive trace layer 62, wire bonded to the IC-contact pads 11*g* of the power IC die 11, can be used to effect contacts external to the inductive power electronics package 300, through the through holes 65*a* as later explained. Although not shown here to avoid excessive obscuring details, for fine inductance adjustment of the power inductor 12 the ferrite chip 15 can be made with one or more air gaps along its magnetic loop.

As each of the bottom conductive trace layer 64 and the top conductive trace layer 62 of the printed circuit board 61 can be independently patterned with a large variety of conductive trace design geometries plus a number of interconnecting conductive through holes through the insulation layer 65, the bottom conductive trace layer 64 has been made, as illustrated, with numerous bottom conductive traces 64*a* through 64*g* plus numerous conductive through holes 65*a*. Correspondingly, the top conductive trace layer 62 also has numerous conductive through holes 65*a* matching the location of their counter parts on the bottom conductive trace layer 64.

This allows for external connections to be made on the bottom conductive traces 64a-g which are connected to corresponding top conductive traces 63a-e and 62a and 62f (bottom conductive traces 64f and 64g are connected to half coil patterned conductive traces 62f and 62a, respectively). A special case of the bottom conductive trace 64a is an enlarged bottom ground plane 64m usually employed for the purpose of signal shielding against EMI/RFI (electromagnetic interference/radio frequency interference) and for heat conduction. In a more specific embodiment, the printed circuit board 61 can be made of a bismaleimide-triazine (BT) substrate or another type of MCL. While the power IC die 11 is illustrated to be located next to the exterior of the ferrite chip 15, with proper sizing of the power IC die 11 and ferrite chip 15 and its interior window 16, the power IC die 11 can instead be located inside the interior window 16 for interconnecting the bottom half-coil patterned conductive traces with the top half-coil forming bond wires within the interior window 16. If so desired, the power IC die 11 can even be placed atop the ferrite chip 15 for potential further reduction of the inductive power electronics package 300 foot print at the expense of an increased package thickness. The power IC die 11 may include a power transistor integrated with a control circuit for controlling the power transistor.

In compact inductive power electronics package 300, the circuit substrate is the printed circuit board 61 and the bottom half-coil forming elements are the half-coil patterned conductive traces 62a-62d, 62f and 62A-62D. By now, it should become clear that in general a printed circuit board of more than 2-layers or a multi-layer circuit laminate (MCL) can be used for the compact inductive power electronics package with correspondingly increased packaging flexibility. In fact, the PCB 61 can be replaced by any circuit substrate that includes suitable bottom half-coil forming elements, such as a bottom lead frame as shown in FIGS. 7A to 7B, and FIGS. 8A to 8B. The top half-coil-forming elements are the bond wires 19. The bond wires 19 may be replaced by any suitable top half-coil forming elements, such as top lead frame leads as shown in FIGS. 7A to 7C or by interconnection plates. The inductive power electronics package may comprise a discrete power inductor, as shown in FIGS. 7A to 7C, or it may include a power inductor packaged together with a power IC chip, as shown in FIG. 1A. Further embodiments demonstrating the flexibility of design in this invention are shown in FIG. 2 through FIG. 4.

FIG. 2 illustrates a second embodiment of the present invention compact inductive power electronics package 350 with a power inductor 12 of closed magnetic loop located atop a lead frame. The various parts are shown in phantom lines through the encapsulant 101. Like FIG. 1A, the power inductor 12 has a core ferrite chip 15 in the shape of a rectangle with an interior window 16. The lead frame has a first number of bottom half-coil conductive leads 17a through 17g positioned beneath the ferrite chip 15. In essence, the bottom half-coil conductive leads 17a through 17g form a bottom half-coil of the power inductor 12. Correspondingly, a second number of top half-coil forming bond wires 19a through 19f are located atop the ferrite chip 15 with each bond wire looping the ferrite chip 15 from above. Furthermore, both ends of each top half-coil forming bond wire are connected to proper alternative bottom half-coil conductive leads so as to jointly form an inductive coil enclosing the ferrite chip 15. Thus, for example, the ends of top half-coil forming bond wire 19a are respectively bonded to the bottom half-coil conductive leads 17a and 17b. The ends of top half-coil forming bond wire 19b are respectively bonded to the bottom half-coil conductive leads 17b and 17c. The ends of top half-coil forming bond wire 19c are respectively bonded to the bottom half-coil conductive leads 17c and 17d, etc. Finally, the ends of top half-coil forming bond wire 19f are respectively bonded to the bottom half-coil conductive leads 17f and 17g. As a result, the bottom half-coil conductive leads 17a and 17g of the lead frame also become the two device terminals of the power inductor 12 for connection to the exterior of the inductive power electronics package 350.

FIG. 3A through FIG. 3D illustrate another embodiment of a discrete power inductor 70 that is similar to previous embodiment except for the replacement of the bottom lead frame with a multi-layer circuit laminate (MCL), such as a two-layer printed circuit board 71. The two-layer printed circuit board 71 has a top conductive trace layer 72, a bottom conductive trace layer 74 and an intervening insulation layer 75 isolating the conductive trace layers 72 and 74 from each other. FIG. 3A is a side cross sectional view of the discrete power inductor 70. FIG. 3B is a top view of the top conductive trace layer 72. FIG. 3C is a bottom view of the printed circuit board 71 showing the bottom conductive trace layer 74. FIG. 3D is a top view of the discrete power inductor 70 with its encapsulant 101 removed for better visibility of the various internal components. Thus, the half-coil patterned conductive traces 72a through 72g of the top conductive trace layer 72 would be patterned and would serve a function similar to the half-coil patterned conductive traces 62a-62d, 62f and 62A-62D of FIGS. 1A-1D.

As each of the bottom conductive trace layer 74 and the top conductive trace layer 72 of the printed circuit board 71 can be independently patterned with a large variety of conductive trace design geometries plus a number of interconnecting conductive through holes through the insulation layer 75, the bottom conductive trace layer 74 has been made, as illustrated, with numerous bottom conductive traces 74a-74c, and 74f-74g, plus conductive through holes 75a and 75b. The conductive through holes 75a and 75b connect from the inductor (traces 72f and 72g) to the bottom side of the printed circuit board 71 (traces 74f and 74g), and thus allow connection from the inductor to the outside.

The printed circuit board 71 further includes, in contact with its bottom conductive traces 74a-74c, 74f-74g, a number of peripheral contact bumps such as 115e and 115a for making external connections from the printed circuit board 71. Bumps may be placed under the bottom traces 74a-74c purely for purposes of stability, whereas bumps under bottom traces 74f and 74g also serve to allow electrical connection to the outside. In a more specific embodiment, the printed circuit board 71 can be made with a bismaleimide-triazine (BT) substrate. As can be seen in FIG. 3A, an encapsulant 101 protects the top portion of the discrete power inductor 70, including the ferrite chip 15, bonding wires 79a-79f, and top conductive trace layer 72.

In the embodiment shown in FIGS. 3A to 3D (discrete power inductor 70), the circuit substrate with the bottom half-coil forming elements is the PCB 71 with top conductive trace layer 72. The top half-coil forming elements are the bonding wires 79a-79f. The inductor core 15 (which may be a ferrite chip) has a window 16.

FIG. 4A through FIG. 4C illustrate another embodiment of a discrete power inductor 40 using a number of peripheral standoff bumps such as 43b and 43c at the bottom of lead frame 41 and top half-coil forming interconnection plates 42a through 42h at its top. FIG. 4A is a top view with the encapsulant 101 removed for better visibility of the various internal components. FIG. 4B is a top view of the lead frame 41 by itself. FIG. 4C is a side view of the discrete power inductor 40. Instead of using bond wires as in FIG. 1A, a number of three dimensionally formed top half-coil forming interconnection plates 42a through 42h, each looping the inductor core 15 from above and further connecting with proper alternative members of the bottom half-coil forming conductive leads 41a through 41j, are employed to form the inductive coil. Thus, for example, the ends of top half-coil forming interconnection plate 42a are respectively bonded to the bottom half-coil patterned conductive leads 41a and 41b. The ends of top half-coil forming interconnection plate 42b are respectively bonded to the bottom half-coil patterned conductive leads 41b and 41c. The ends of top half-coil forming interconnection plate 42c are respectively bonded to the bottom half-coil patterned conductive lead 41c and 41d, etc. Finally, the ends of top half-coil forming interconnection plate 42h are respectively bonded to the bottom half-coil patterned conductive leads 41h and 41i. As a result, the bottom half-coil patterned conductive leads 41a and 41i also become the two device terminals of the power inductor for circuit connection with the outside. Comparing with the bond wires, inductive coils formed with top half-coil forming interconnection plates enjoy the advantage of lower coil resistance.

A number of peripheral standoff bumps 43b and 43c are attached to the bottom of bottom half-coil patterned conductive leads 41d and 41f. For stability, there are at least three peripheral standoff bumps, although only two are needed to form electrical connections with the inductor.

In general, an encapsulant may enclose the top portion of the inductor package, including the inductor core and the top half-coil forming elements. The encapsulant serves to protect and electrically insulate the enclosed parts. This is especially advantageous when a fragile ferrite chip is used for the inductor core and when bond wires or interconnection plates are used for the top half-coil forming elements. As an example, the encapsulant may be a standard molding compound. In a more specific embodiment, the encapsulant may include embedded magnetic particles to increase the inductance value of the power inductor.

To those skilled in the art, the numerous top half-coil forming bond wires 19a through 19f can be replaced with top lead frame leads each looping the ferrite chip 15 from above and further connecting with proper alternative members of the bottom half-coil conductive leads 17a through 17g below to form the inductive coil. As another alternative, the top half-coil forming bond wires 19a through 19f can be replaced with three dimensionally formed top interconnection plates each looping the ferrite chip 15 from above and further connecting with proper alternative members of the bottom half-coil conductive leads 17a through 17g below to form the inductive coil as well. Comparing with the bond wire, inductive coils formed with top interconnection plates enjoy the advantage of lower coil resistance.

Referring again to FIG. 1A through FIG. 1F, a corresponding method for making the inductive power electronics package 300 should include:

Providing the printed circuit board 61 having numerous half-coil patterned conductive traces such as 62a through 62D atop.

Attaching the power inductor 12 atop the printed circuit board 61 by placing the ferrite chip 15 atop the half-coil patterned conductive traces. As an added option, also attaching the power IC die 11 atop the printed circuit board 61.

Attaching numerous top half-coil forming bond wires such as 19a through 19D such that they are interconnected with the numerous half-coil patterned conductive traces below so as to jointly form an inductive coil enclosing the ferrite chip 15.

In a more specific embodiment, attaching a top half-coil forming means may further comprise attaching one end of each top half-coil forming means to an end of a bottom half-coil forming means within the interior window, and also attaching the other end of the top half-coil forming means to an end of an adjacent bottom half-coil forming means outside the ferrite chip.

The method may also further comprise a step of encapsulating the top portion of the inductive power electronics package with an encapsulant.

By now it should become clear to those skilled in the art that the numerous embodiments just described can be readily modified to suit other specific applications as well. While the description above contains many specificities, these specificities should not be constructed as accordingly limiting the scope of the present invention but as merely providing illustrations of numerous presently preferred embodiments of this invention.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A compact inductive power electronics package comprising:
    a circuit substrate;
    a power inductor, attached atop the circuit substrate, having an inductor core of closed magnetic loop wherein the inductor core has an interior window;
    said circuit substrate further comprises a bottom half-coil forming means constituting a bottom half-coil beneath the inductor core;
    a top half-coil forming means for jointly forming, with the bottom half-coil forming means, an inductive coil enclosing the inductor core; and
    an inner connection chip, having a top plane and a bottom plane and being located in the interior window of the inductor core for interconnecting the bottom half-coil forming means to the top half-coil forming means within the interior window; and
    the top half-coil forming means having inner contact sections disposed on the top plane and outer contact sections disposed on the bottom plane
    whereby forming the inductive coil and realizing a compact inductive power electronics package with high inductor rating.

2. The inductive power electronics package of claim 1 wherein the closed magnetic loop further comprises an air gap.

3. The inductive power electronics package claim 1 further comprises a power Integrated Circuit (IC) and a circuit interconnecting means for interconnecting the power IC and the power inductor.

4. The inductive power electronics package of claim 3 wherein the power IC is located on the top side of the circuit substrate.

5. The inductive power electronics package of claim 1 wherein said circuit substrate is a lead frame and said bottom half-coil forming means further comprises a plurality of lead frame traces forming the bottom half-coil.

6. The inductive power electronics package of claim 1 wherein said top half-coil forming means further comprises a plurality of top lead frame leads each looping the inductor core from above and further connecting, via the inner connection chip, with proper alternative members of the bottom half-coil forming means whereby forming the inductive coil.

7. The inductive power electronics package of claim 1 wherein said top half-coil forming means further comprises a plurality of top bond wires each looping the inductor core from above and further connecting, via the inner connection chip, with proper alternative members of the bottom half-coil forming means whereby forming the inductive coil.

8. The inductive power electronics package of claim 1 wherein said top half-coil forming means further comprises a plurality of three dimensionally formed top interconnection plates each looping the inductor core from above and further connecting, via the inner connection chip, with proper alternative members of the bottom half-coil forming means whereby forming the inductive coil.

9. The inductive power electronics package of claim 1 wherein said circuit substrate is a multi-layer circuit laminate (MCL) further comprising a top conductive trace layer having a plurality of half-coil patterned conductive traces constituting the bottom half-coil forming means.

10. The inductive power electronics package of claim 9 further comprising a bottom conductive trace layer wherein traces of the top conductive trace layer are connected to traces of the bottom conductive trace layer.

11. The inductive power electronics package of claim 9 wherein said MCL is a printed circuit board (PCB).

12. The inductive power electronics package of claim 9 wherein said MCL is a bismaleimide triazine (BT) substrate.

13. The inductive power electronics package of claim 1 further comprising an encapsulant, encapsulating the top portion of the inductive power electronics package.

14. A method for making an inductive power electronics package, the method comprises:
   providing a circuit substrate comprising a bottom half-coil forming means atop;
   attaching a power inductor atop the circuit substrate, wherein attaching the power inductor further comprises placing an inductor core of closed magnetic loop atop the bottom half-coil forming means wherein the inductor core has an interior window;
   placing an inner connection chip having a top plane and a bottom plane in the interior window for interconnecting the bottom half-coil forming means to the top half-coil forming means within the interior window; and
   attaching a top half-coil forming means having inner contact sections disposed on the top plane and outer contact sections disposed on the bottom plane such that it is interconnected within the interior window through the inner connection chip to the bottom half-coil forming means so as to jointly form an inductive coil enclosing the inductor core.

15. The method for making an inductive power electronics package of claim 14 wherein attaching a top half-coil forming means further comprises attaching one end of each top half-coil forming means to an end of a bottom half-coil forming means through the inner connection chip within the interior window, and also attaching the other end of the top half-coil forming means to an end of an adjacent bottom half-coil forming means outside the inductor core.

16. The method for making an inductive power electronics package of claim 14 further comprising:
   attaching a power Integrated Circuit (IC) atop the circuit substrate.

17. The method for making an inductive power electronics package of claim 14 further comprises encapsulating the top portion of the inductive power electronics package with an encapsulant.

18. The inductive power electronics package of claim 1 wherein the inner connection chip further comprises, corresponding to the geometry of the bottom half-coil forming means and the top half-coil forming means, a plurality of conductive through vias spaced and configured to effect interconnection there between.

19. The inductive power electronics package of claim 1 wherein ones of said top half-coil forming means connect on one end, through the inner connection chip, with one of the bottom half-coil forming means inside the interior window of the inductor core and on the other end with an adjacent bottom half-coil forming means outside the inductor core thus forming said inductive coil.

20. The inductive power electronics package of claim 1 wherein said inductor core has a toroid shape.

* * * * *